(12) United States Patent
Krauss

(10) Patent No.: US 8,344,502 B2
(45) Date of Patent: Jan. 1, 2013

(54) SEMICONDUCTOR MODULE AND A METHOD FOR PRODUCING AN ELECTRONIC CIRCUIT

(75) Inventor: Andreas Krauss, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 308 days.

(21) Appl. No.: 12/501,983

(22) Filed: Jul. 13, 2009

(65) Prior Publication Data

US 2010/0019378 A1    Jan. 28, 2010

(30) Foreign Application Priority Data

Jul. 25, 2008  (DE) .................. 10 2008 040 727

(51) Int. Cl.
*H01L 23/34* (2006.01)

(52) U.S. Cl. ........................ 257/712; 438/106

(58) Field of Classification Search ............. 257/712; 438/106

See application file for complete search history.

(56) References Cited

U.S. PATENT DOCUMENTS

| | | | | |
|---|---|---|---|---|
| 5,998,240 A * | 12/1999 | Hamilton et al. | ............ | 438/122 |
| 6,670,751 B2 * | 12/2003 | Song et al. | ............ | 313/512 |
| 7,030,485 B2 * | 4/2006 | Houle et al. | ............ | 257/712 |
| 7,190,581 B1 * | 3/2007 | Hassani et al. | ............ | 361/699 |
| 7,795,724 B2 * | 9/2010 | Brodsky et al. | ............ | 257/712 |
| 2004/0262743 A1 * | 12/2004 | Houle et al. | ............ | 257/712 |
| 2006/0252179 A1 * | 11/2006 | Chen | ............ | 438/106 |
| 2007/0262387 A1 | 11/2007 | Nonaka et al. | | |
| 2010/0155769 A1 * | 6/2010 | Lin et al. | ............ | 257/99 |

* cited by examiner

*Primary Examiner* — Julio J Maldonado
*Assistant Examiner* — Robert Bachner
(74) *Attorney, Agent, or Firm* — Kenyon & Kenyon LLP

(57) ABSTRACT

A semiconductor module has at least one die, made of silicon carbide, in which semiconductor components are patterned. The die includes at least one exposed surface for contacting an external heat sink.

7 Claims, 2 Drawing Sheets

SEMICONDUCTOR MODULE AND A METHOD FOR PRODUCING AN ELECTRONIC CIRCUIT

FIELD OF THE INVENTION

The present invention relates to a semiconductor module, especially a power output element, and a method for producing an electronic circuit.

BACKGROUND INFORMATION

A power semiconductor component module is described in U.S. Patent Application No. 2007/0262387, which has an integrated printed-circuit board having a metallic substrate electrode, an insulating substrate and a heat sink. The heat sink is connected to a die via several intermediate layers.

SUMMARY OF THE INVENTION

The present invention relates to a semiconductor module. The semiconductor module has at least one die, made of silicon carbide, in which semiconductor components are patterned. The die includes at least one exposed surface for contacting an external heat sink.

According to the present invention, it was realized that a direct coupling of a heat sink to a semiconductor module made of silicon carbide is possible. A large heat flow is able to be achieved thereby, which in particular is not limited by boundary surfaces between various materials of individual heat shunts.

One method for producing a semiconductor module provides the following steps: Inserting a window in a carrier substrate; positioning a die on the carrier substrate, one surface of the die covering the window; and positioning a housing which covers a part of the die for protection from environmental influences and leaves the window free.

DETAILED DESCRIPTION

Figure 1:
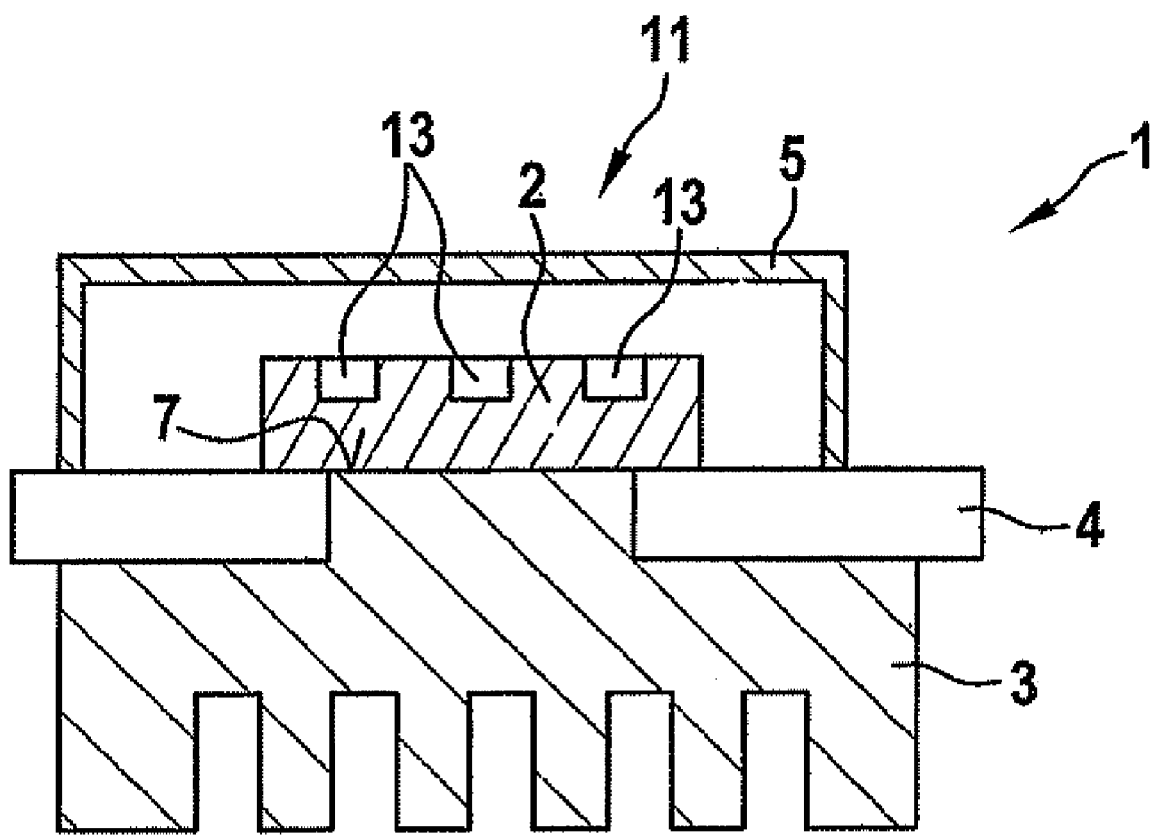
FIG. 1 shows a partial section through a semiconductor module.

One specific embodiment of a semiconductor module 1 is explained below with reference to a partial section in FIG. 1. Semiconductor module 1 has a die 2 and a supporting plate 4. Semiconductor module 1 may additionally have a housing 5. A heat sink 3 is able to be connected to semiconductor module 1. Heat sink 3 may be made monolithically of a cast body or a milled body, of aluminum, for example. In another specific embodiment, heat sink 3 is an integral component of semiconductor module 1.

Die 2 is made of silicon carbide. Silicon carbide is particularly suitable for power semiconductor components because of its low band gap and its high thermal conductivity.

Semiconductor components may be patterned in a wafer made of silicon carbide using the usual patterning methods. The wafer is subsequently cut apart into dice 2. Dice 2 are unhoused, that is, they are not surrounded by any subsequently applied protective layer or jacket.

Bare die 2 is situated on a carrier substrate 4, for instance a printed-circuit board. Printed-circuit board 4 may have external terminals of semiconductor module 1. Printed-circuit board 4 connects the external terminals to the contacts on die 2.

A housing 5 partially surrounds die 2. The regions of die 2 patterned to form semiconductor components 13 are preferably encapsulated by housing 5, and protected from environmental influences. Housing 5 may be made of a plastic or a metal.

Housing 5 has at least one window. In the specific embodiment shown in FIG. 1, the housing surrounds only the topside of die 2. As a result, die 2 has at least one exposed surface 7, which is in direct contact with the environment. It is particularly provided that the exposed surface should not be covered by carrier substrate 4, housing 5, a cover layer, a diffusion barrier, etc.

Semiconductor module 1, that is shown, utilizes the fact that silicon carbide demonstrates great chemical stability compared to silicon. Migration of gases or foreign atoms from the environment through the silicon carbide substrate is so slight that no substantial impairment occurs of the operativeness of semiconductor components in die 2.

An external heat sink 3 may be positioned through the window in the housing in direct contact with exposed surface 7 of die 2. A large heat outflow from die 2 may be achieved thereby.

A heat-conductive paste may be inserted between external heat sink 3 and die 2, to adjust for unevenesses. The intermediate connection of additional heat shunts is avoided, since any additional bordering surface may lower the specific thermal conductivity.

Figure 2:
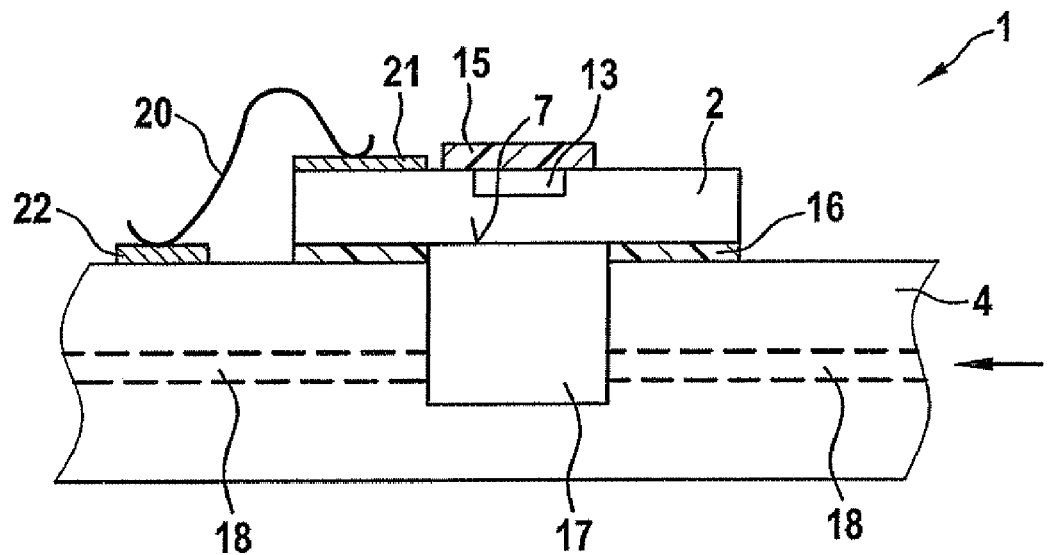
FIG. 2 shows a partial section through an additional semiconductor module.

A further specific embodiment of a semiconductor module 1 is explained below with reference to a partial section in FIG. 2.

A die 2 based on silicon carbide is situated with its back surface on a carrier substrate 4. An adhesion layer 16 connects die 2 to carrier substrate 4. Adhesion layer 16 may be made of a resin, an adhesive or a solder, for example. Solder is particularly suitable if an electrically conductive connection is required between carrier substrate 4 and the substrate of die 2.

The back surface is not covered by adhesion layer 16 in an exposed area 7. A recess 17 is introduced in carrier substrate 4, which may be equivalent to exposed area 7 in its horizontal dimensions. Die 2 and carrier substrate 4 are arranged with respect to each other in such a way that exposed area 7 and the recess define a cavity in carrier substrate 4.

Horizontally running supply lines 18 to recess 17 or the cavity may be situated in carrier substrate 4. A cooling circulation system may be connected to supply lines 18. A cooling fluid may flow into the cavity and carry off heat from die 2 by direct contact with die 2 in the area of exposed surface 7. Recess 17 may also be a part of a "heat pipe" system.

A housing may cover the topside of die 2, as in the specific embodiment in FIG. 1. In the variant shown in FIG. 2, only patterned areas 13 of die 2 are covered by a protective layer 15.

Electric contacting of die 2 is able to take place by bonding wires 20 and corresponding contacts 21, 22 on die 2 and printed-circuit board 4. Bonding wires 20 and contacts 21, 22 may be arranged to be exposed, that is, outside of a housing.

Figure 3:
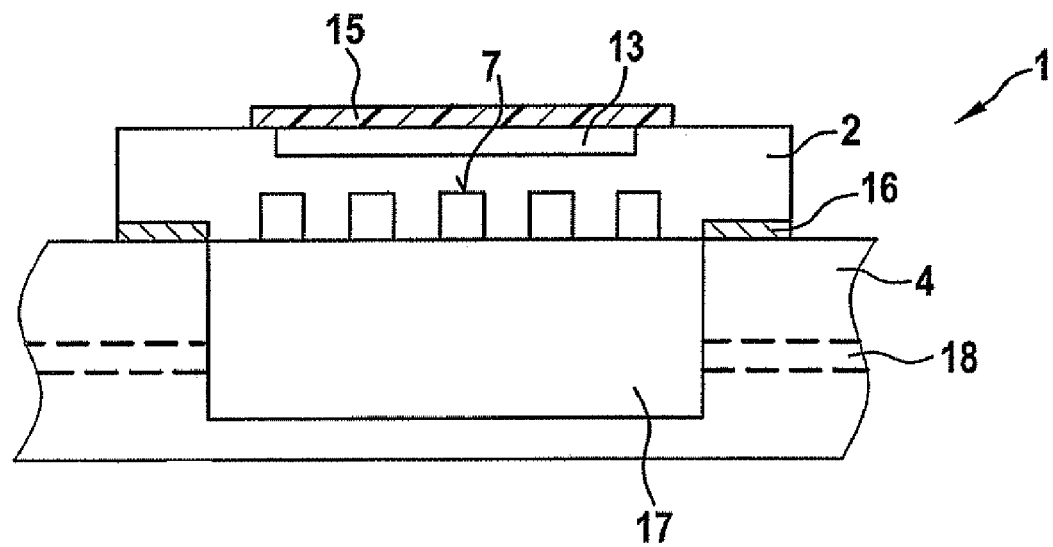
FIG. 3 shows a partial section through an additional semiconductor module.

A further specific embodiment of a semiconductor module 1 is explained below with reference to a partial section in FIG. 3.

Exposed surface 7 may have a depth profile in order to increase its surface. The cooling fluid is consequently able to wet a greater surface. This makes possible a greater heat dissipation. Because of the patterning of the surface, the recirculation of the heat transportation medium via capillary force may be achieved in response to the use of a "heat pipe" system.

Exposed surface 7 may be situated on the topside of die 2.

Recess 17 may be filled up with a metal body. The metal body may have borings for passing through cooling fluid.

The patterning of exposed surface 7 may take place during the production of die 2. Before or after the generation of semiconductor component 13, a mask is applied to the back surface. The depth profile is etched in using an etching method.

The mask may be made of a metal. The metallic mask may remain on die 2 and form a seal or connection 16 between carrier substrate 4 and die 2. The connection may be achieved, for instance, by cold welding, sintering or ultrasound welding. The metallic mask may also provide an electrical connection between carrier substrate 4 and die 2.

One method for producing a semiconductor module 1 provides at least the following steps. Semiconductor components are formed on the silicon carbide wafer, among other things, by etching methods, implantation methods, metallization methods and tempering methods. A mask may be applied on the back surface of the wafer. In the areas not masked, the wafer is thinned, so that local recesses are created. The local recesses are situated in the areas which will later be exposed in semiconductor module 1, that is, they are in contact with the cooling fluid or heat sink 3. After that, semiconductor module 1 is diced up by cutting apart the wafer.

A recess 17 is introduced into carrier substrate 4, by an etching or milling method. Recess 17 preferably has the same horizontal dimensions as exposed surface 7 of die 2. An adhesion layer 16 is applied onto carrier substrate 4, at least along an edge of recess 17. Adhesion layer 16 may have a resin, a solder, a metal layer, etc.

Individual semiconductor modules 1 are set onto carrier substrate 4. Semiconductor module 1 is aligned, in this context, with its exposed surface 7 to a recess 17 or a later window in housing 5.

The connection between die 2 and carrier substrate 4 is generated by heating, by pressure and/or ultrasound action on adhesion layer 16.

What is claimed is:

1. A semiconductor module comprising:
   a heat sink;
   at least one die made of silicon carbide, the die having at least one exposed surface for contacting the heat sink;
   semiconductor components patterned in the die; and
   a carrier substrate having a recess, the die with its exposed surface being situated oppsite to the recess, so that the exposed surface and the recess form a cavity.

2. The semiconductor module according to claim 1, wherein the exposed surface, free from an adhesive material, is in contact with the heat sink.

3. The semiconductor module according to claim 1, wherein the heat sink is made of a metal block which is situated to be in contact with the exposed surface or the heat sink has a cooling circulation using a cooling fluid, the cooling fluid being in contact with the exposed surface.

4. The semiconductor module according to claim 1, wherein the exposed surface has patterns for enlarging its surface.

5. The semiconductor module according to claim 4, wherein the patterns are a part of a heat pipe for transporting a cooling medium via capillary forces.

6. The semiconductor module according to claim 1, further comprising a protective layer situated on the die, which covers the semiconductor components and which has a window in an area of the exposed surface.

7. The semiconductor module according to claim 1, wherein t heat sink is a cooling body which is situated partially outside a housing of the semiconductor module.

* * * * *